United States Patent
DeNatale et al.

(10) Patent No.: US 7,810,379 B2
(45) Date of Patent: Oct. 12, 2010

(54) HIGH TEMPERATURE MICROELECTROMECHANICAL (MEM) DEVICES

(75) Inventors: Jeffrey F. DeNatale, Thousand Oaks, CA (US); Robert L. Borwick, III, Thousand Oaks, CA (US); Philip A. Stupar, Oxnard, CA (US)

(73) Assignee: Rockwell Scientific Licensing LLC, Thousand Oaks, CA (US)

( * ) Notice: Subject to any disclaimer, the term of this patent is extended or adjusted under 35 U.S.C. 154(b) by 186 days.

(21) Appl. No.: 11/897,708

(22) Filed: Aug. 30, 2007

(65) Prior Publication Data

US 2008/0238446 A1 Oct. 2, 2008

Related U.S. Application Data

(62) Division of application No. 11/222,721, filed on Sep. 8, 2005, now Pat. No. 7,303,935.

(51) Int. Cl.
*G01N 11/00* (2006.01)
(52) U.S. Cl. .................................................. 73/54.01
(58) Field of Classification Search .................. 73/54.01
See application file for complete search history.

(56) References Cited

U.S. PATENT DOCUMENTS

| 6,872,319 | B2 * | 3/2005 | Tsai | 216/2 |
| 2004/0113513 | A1 * | 6/2004 | Borwick et al. | 310/309 |
| 2008/0238446 | A1 * | 10/2008 | DeNatale et al. | 324/663 |

* cited by examiner

*Primary Examiner*—Hezron Williams
*Assistant Examiner*—Mark Shabman
(74) *Attorney, Agent, or Firm*—Koppel, Patrick, Heybl & Dawson

(57) ABSTRACT

A microelectromechanical (MEM) device per the present invention comprises a semiconductor wafer—typically an SOI wafer, a substrate, and a high temperature bond which bonds the wafer to the substrate to form a composite structure. Portions of the composite structure are patterned and etched to define stationary and movable MEM elements, with the movable elements being mechanically coupled to the stationary elements. The high temperature bond is preferably a mechanical bond, with the wafer and substrate having respective bonding pads which are aligned and mechanically connected to form a thermocompression bond to effect the bonding. A metallization layer is typically deposited on the composite structure and patterned to provide electrical interconnections for the device. The metallization layer preferably comprises a conductive refractory material such as platinum to withstand high temperature environments.

20 Claims, 5 Drawing Sheets

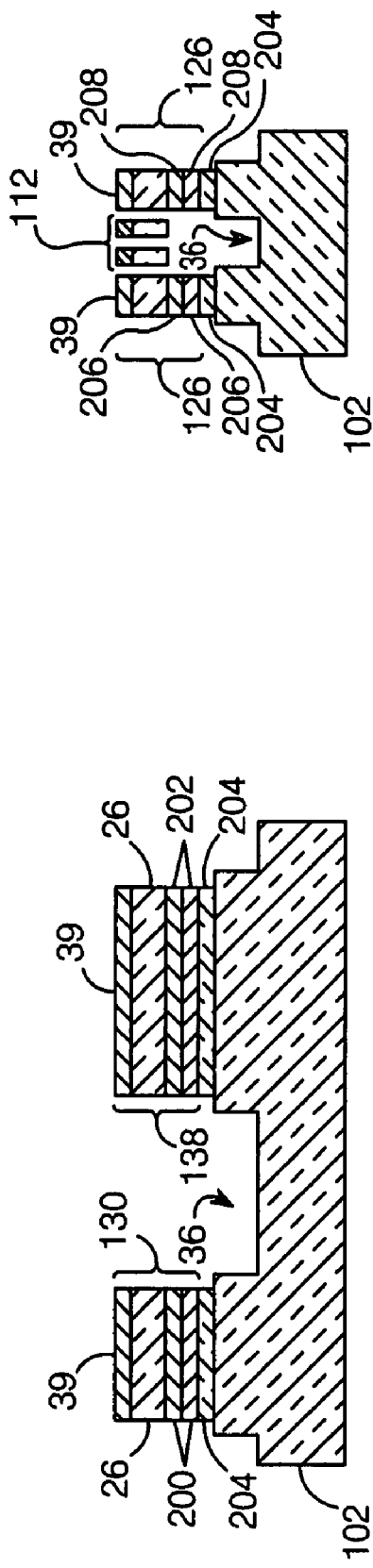
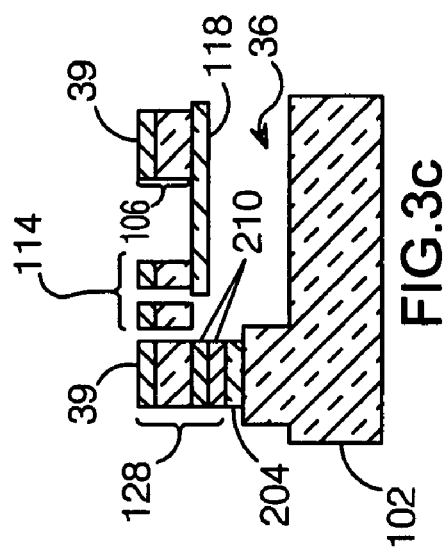
FIG.3a
FIG.3b
FIG.3c

HIGH TEMPERATURE MICROELECTROMECHANICAL (MEM) DEVICES

RELATED APPLICATIONS

This application is a divisional of patent application Ser. No. 11/222,721 to DeNatale et al., filed Sep. 8, 2005 now U.S. Pat. No. 7,303,935.

BACKGROUND OF THE INVENTION

1. Field of the Invention

This invention relates to the field of microelectromechanical (MEM) devices, and particularly to MEM devices for use in high temperature environments.

2. Description of the Related Art

Microelectromechanical (MEM) devices—i.e., integrated devices which include at least one moveable element that moves relative to a stationary element—have become commonplace. Such devices have found many applications, including switches, tunable capacitors, current sensors, viscosity sensors, accelerometers and the like.

One approach to fabricating MEM devices, described, for example, in U.S. Pat. No. 6,159,385 and U.S. Patent Application Publication US 2004/0113513, involves the use of a silicon-on-insulator (SOI) wafer and a substrate. The SOI wafer, which includes a layer of doped silicon and an oxide layer, is bonded to the substrate using an organic adhesive to form a composite structure. The doped layer is patterned and etched to form the moveable elements, and the structure is then processed to undercut the adhesive and release the moveable elements. A metallization layer is typically deposited, masked and etched to provide electrical interconnections for the MEM device.

However, devices fabricated in this manner may fail if subjected to high temperatures. For example, a MEM viscosity sensor, such as that described in co-pending patent application Ser. No. 10/956,229 filed on Sep. 30, 2004 and assigned to the same assignee as the present application, must be immersed in the fluid being monitored. If the fluid temperature is high, the device's organic adhesive can degrade and compromise the device's structural integrity. In addition, the metallization layer, typically aluminum-based, may also be adversely affected by exposure to high temperature fluids.

SUMMARY OF THE INVENTION

MEM devices are presented which overcome the problems noted above, providing MEM devices suitable for use in high temperature environments.

A MEM device per the present invention includes a stationary element and a movable element displaceable relative to the stationary element. The device comprises a semiconductor wafer which is typically an SOI wafer, a substrate, and a high temperature bond which bonds the wafer to the substrate to form a composite structure. Portions of the composite structure are patterned and etched to define the stationary and movable MEM elements, with the movable elements being mechanically coupled to the stationary elements.

The high temperature bond is preferably a thermocompression bond, with the wafer and substrate having respective bonding pads which are aligned and mechanically connected such that a thermocompression bond is formed to effect the bonding.

A MEM device per the present invention would also typically include one or more metallization layers deposited on the composite structure and patterned and etched to provide electrical interconnections for the device. The metallization layers preferably comprise a conductive refractory material such as platinum, to withstand high temperature environments. Here, the term metallization is used to describe an electrically continuous interconnect, and in general includes non-metallic electrical conductors.

A MEM viscosity sensor designed to sense the viscosity of a fluid in which it is immersed is one device suitably fabricated as described above—i.e., with high temperature bond and metallization materials—though many other MEM device types might also benefit from the described fabrication method.

Further features and advantages of the invention will be apparent to those skilled in the art from the following detailed description, taken together with the accompanying drawings.

BRIEF DESCRIPTION OF THE DRAWINGS

FIGS. 3a-3c are cross-sectional views of the sensor in FIG. 2, cut along section lines A-A, B-B and C-C, respectively.

DETAILED DESCRIPTION OF THE INVENTION

The present invention is directed to MEM devices that enables the devices to withstand higher temperatures than similar devices fabricated using prior art methods. Epoxy and metallization that might degrade under high temperature conditions are replaced with a high temperature bonding material and refractory metals, greatly extending the range of temperatures over which MEM devices such as a viscosity sensor can operate without failing.

In general, MEM devices per the present invention have a stationary element and a movable element displaceable relative to the stationary element. Each device comprises a semiconductor wafer—preferably an SOI wafer, a substrate—which can be insulating or conductive, and a high temperature bond which bonds the wafer to the substrate to form a composite structure. Portions of the composite structure are patterned and etched to define the stationary and movable MEM elements such that the movable elements are mechanically coupled to the stationary elements.

The high temperature bond is preferably a mechanical bond. In a preferred embodiment, the wafer and substrate have respective bonding pads, which are aligned and mechanically connected such that a thermocompression bond is formed to effect the bonding of the wafer to the substrate. The bonding pads are preferably gold (Au), such that the resulting bond is a high temperature Au—Au thermocompression bond. The mechanical bond is used in lieu of the organic epoxy employed for the same purpose in prior art devices.

A device per the present invention typically includes one or more metallization layers, which are deposited on the composite structure and patterned and etched to provide electrical interconnections for the MEM device. As noted above, as used herein, the term "metallization" describes an electrically continuous interconnect, and in general includes non-metallic electrical conductors. The metallization layers preferably comprise a refractory conductive material, such as platinum, iridium, gold, or titanium nitride, rather than the aluminum-based metallization of prior art devices. The use of conductive refractory materials and a high temperature bond as described above enable the resulting device to operate reliably at temperatures as high as 150-250° C.

Figures 1A, 1B:
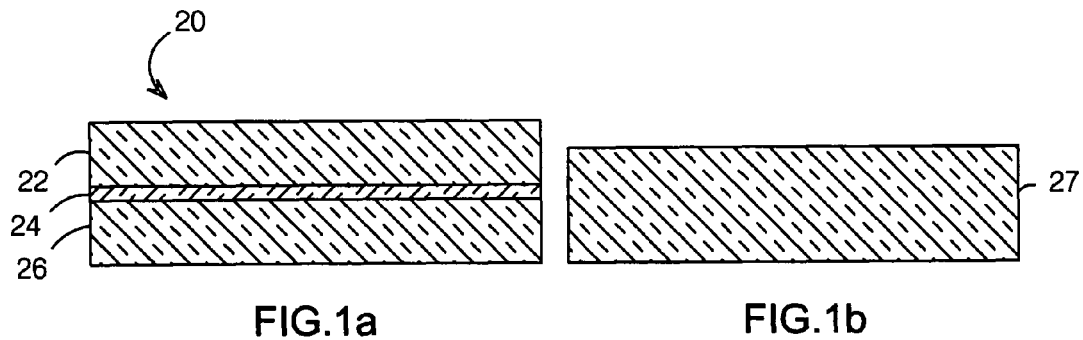
FIGS. 1a-1k depict a MEM device fabrication method suitable for making MEM devices in accordance with the present invention.

One possible fabrication sequence suitable for making MEM devices per the present invention is shown in FIGS. 1a-1k. FIG. 1a shows a wafer 20, preferably a silicon-on-insulator (SOI) wafer, which includes a silicon handle layer 22, a buried silicon dioxide layer 24, and a silicon MEM device layer 26. Silicon handle and device layers 22 and 26 may be undoped or doped with boron, germanium or other known dopants to impart semiconductor properties. The buried silicon dioxide layer functions as an etch stop. Wafer 20 may comprise a commercially available SOI wafer sold by many manufacturers such as Shin-Etsu Handotai Co., Ltd., Japan, or it may be fabricated using common semiconductor techniques.

It will be obvious to skilled artisans that wafer 20 may comprise virtually any kind of suitable wafer. For example, instead of an SOI wafer, the wafer 20 may comprise plain (undoped) silicon so that the wafer itself comprises the device layer. Alternatively, a plain silicon wafer may be doped from one side to define a device layer that may also serve as an etch stop. Several examples of suitable wafers are disclosed in U.S. Pat. No. 6,159,385, which is fully incorporated by reference.

In FIG. 1b, a substrate 27 is provided, which may be insulating or conductive depending on the intended application, and may comprise glass, high resistivity silicon, crystalline sapphire, crystalline silicon, polycrystalline silicon, silicon carbide, or a ceramic such as alumina, aluminum nitride, and the like, or gallium arsenide. In fact, the substrate may comprise any material suitable for supporting a MEM device. As previously noted, substrate 27 may be made of an insulating material, such as Vycor® or Pyrex® glass, or a high resistivity silicon. Alternatively, substrate 27 may be formed from a heavily doped semiconductor material to allow for electrical coupling between substrate 27 and wafer 20. Such supporting substrate may also include semiconductor wafers containing pre-processed circuitry, such as CMOS-containing silicon wafers.

Figures 1C, 1D:
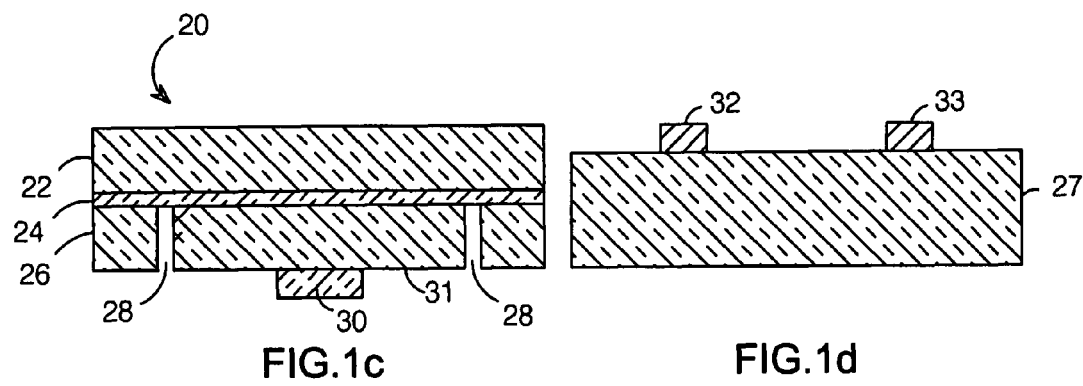

FIG. 1c shows the preferred SOI wafer 20 of FIG. 1a in the next stage of fabrication, with alignment marks 28 etched through the device layer 26. Alignment marks 28 are used to position a bridge 30 formed from a layer of electrically insulating material deposited and patterned on the backside or bottom surface 31 of device layer 26. The insulating material may comprise, by way of example, silicon dioxide, silicon nitride, aluminum oxide, silicon oxynitride or silicon carbide; silicon dioxide is preferred. Deposition and patterning of the bridge 30 on the bottom surface 31 of device layer 26 eliminates having to etch the bridge over a tall step from the top surface of the device layer.

The insulating bridge layer may be deposited on the bottom surface of device layer 26 by any of a variety of processes such as vapor deposition, sputtering, or the like, and then patterned and etched to define the desired structure of bridge 30. The bridge layer is preferably deposited by chemical vapor deposition (CVD) and more preferably by plasma enhanced chemical vapor deposition (PECVD). The dimensions of bridge 30 and the materials from which it is fabricated will depend upon the particular application in which the MEM device is used. Here, a preferred embodiment of the process is described in which a single dielectric layer is deposited onto the bottom surface of the device. Alternately, multiple layers of dielectric and conductive materials may be incorporated into the device process sequence as appropriate.

Figures 1E, 1F:
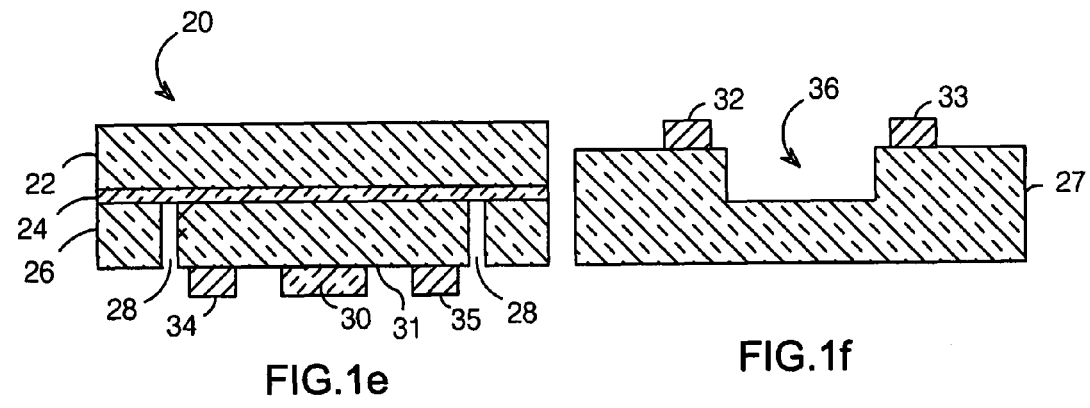

In FIG. 1d, an Au layer has been deposited on substrate 27, from which a pair of Au bonding pads 32 and 33 are patterned and formed. In FIG. 1e, the same steps are performed on bottom surface 31 of wafer 20, to form a pair of Au bonding pads 34 and 35. In FIG. 1f, a device recess 36 is preferably etched into substrate 27; this is particularly beneficial if the device is to be immersed in a fluid, such as a viscosity sensor, to allow fluid flow through the device.

Figure 1G:
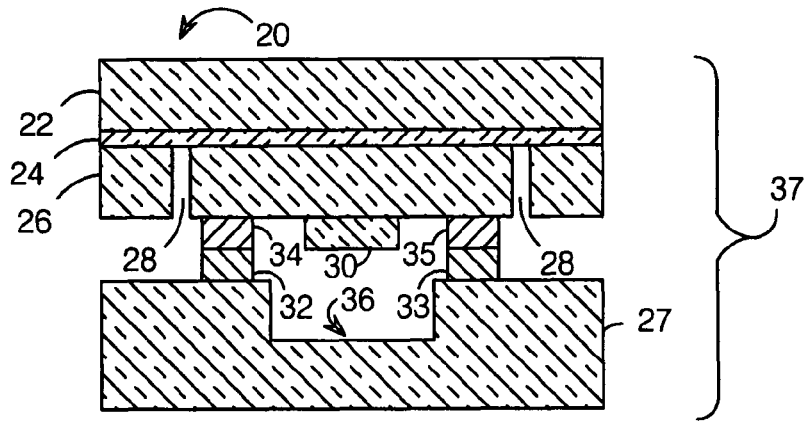

In FIG. 1g, wafer 20 is bonded to substrate 27 to form a composite structure 37. The wafer's bonding pads 34 and 35 are aligned with corresponding bonding pads 32 and 33 on substrate 27, and mechanically connected—i.e., brought into contact with each other and subjected to conditions necessary to effect a mechanical bond between them—to form a robust mechanical bond between wafer 20 and substrate 27. In the preferred embodiment, this bonding is accomplished through an Au—Au thermocompression bond process. Typical conditions for such bonding are a temperature of 350° C. and a pressure of 2000 mbar. Other bonding processes compatible with the device and process constraints would be well known to those skilled in the art.

Figure 1H:
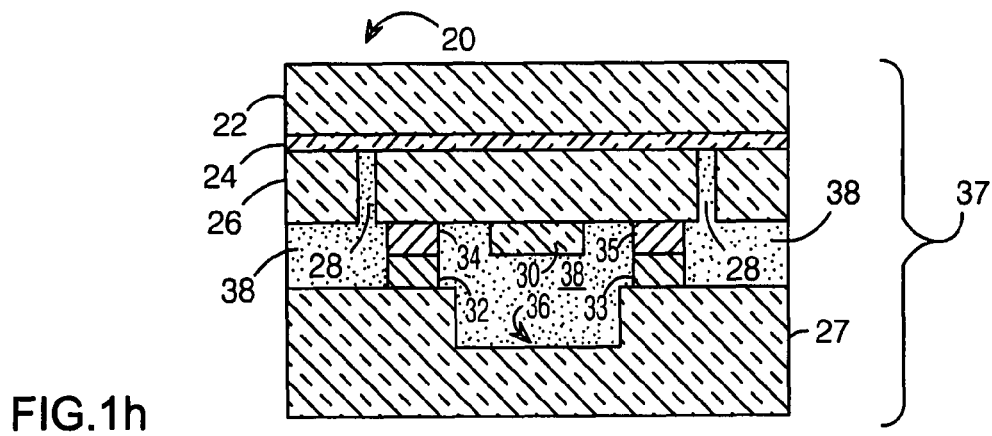

In FIG. 1h, a curable organic sacrificial material—typically an adhesive 38—is employed to underfill gaps in and provide mechanical support for composite structure 37. Such underfill can be accomplished by dispensing the liquid (uncured) adhesive around the edges of the bonded wafer such that it is drawn into the open space between wafers by surface tension. Complete underfill may be facilitated by performing this step in vacuum, followed by exposure to atmospheric pressure to eliminate voids. This adhesive would then be then cured to the solid state to provide mechanical support in subsequent processing. Alternate processes exist for accomplishing this underfill, and would be known to those skilled in the art. Adhesive 38 can comprise any of a number of curable sacrificial organic materials, such as thermally-cured epoxy, UV-cured epoxy, polymide, or BCB.

Figure 1I:
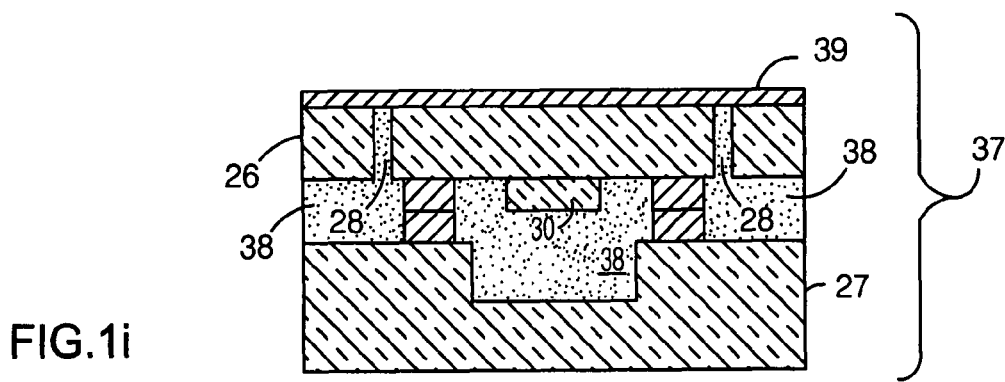

In the next stage of fabrication, illustrated in FIG. 1i, handle layer 22 and buried insulating layer 24 have been removed, and a metallization layer 39, deposited on device layer 26, has been substituted for the removed layers. The removal of handle and insulating layers 22 and 24 exposes the alignment marks 28 so that the location of the patterned bridge 30 is known. The removal of handle layer 22 is preferably accomplished with a wet chemical etch. Insulating layer 24 is preferably removed utilizing a wet etch with hydrogen fluoride (HF). Alternatively, or in combination therewith, the removal of these layers may be accomplished with a dry plasma etch or other semiconductor etching process. As an alternative to etching away the entire handle layer 22, or in combination therewith, portions of handle layer 22 and insulating layer 24 may be removed by a mechanical grind. Accordingly, a wet etch, a dry etch or a mechanical grind can be used by themselves or in any combination.

The metallization layer 39 preferably comprises a conductive refractory material such as platinum, iridium, gold, or titanium nitride, as such materials are able to withstand higher temperatures than aluminum. The metallization layer is deposited or formed using conventional semiconductor fabrication processes such as sputtering or evaporative deposition.

Figure 1J:
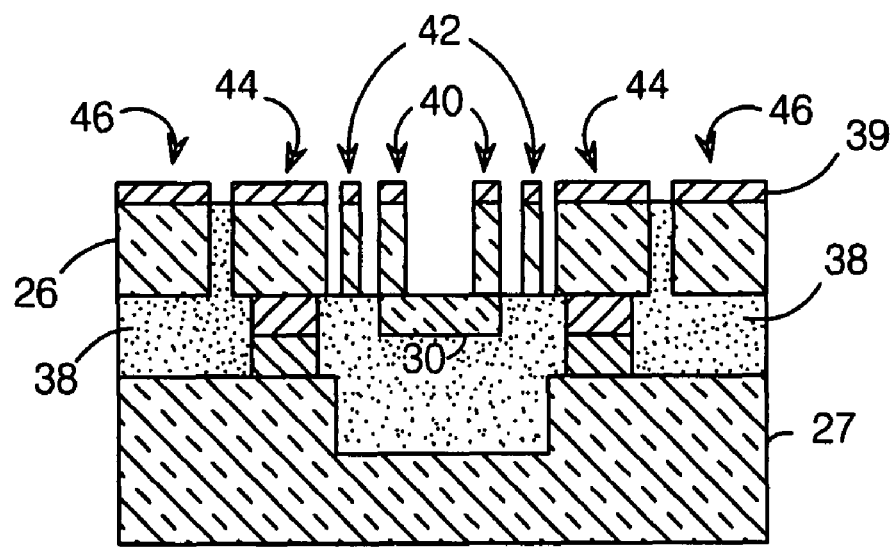

FIG. 1j illustrates the next stage of fabrication, in which the MEM elements are patterned and formed. The patterning is accomplished using standard photolithographic techniques, followed by a conventional semiconductor etch through the metallization layer 39 and the device layer 26. In this example, a pair of upstanding parallel elements 40 have been defined on insulating bridge 30, and another pair of movable elements 42 flank members 40. A pair of stationary MEM elements 44 flank members 42, and another pair of movable elements 46 flank members 44. Metallization layer 39 and device layer 26 may be conveniently patterned using the same mask.

For an aluminum metallization layer, a dry chlorine etch is preferably used to remove selected portions of metallization layer 39; however, other conventional removal or etching techniques, such as reactive ion etching, inductively coupled plasma etching, and ion milling, for example, may be used as appropriate for the specific metallization layer selected. Such techniques are well known to those skilled in the art. A deep reactive ion etch (DRIE) is preferably utilized to etch device layer 26. This type of etching creates very uniform, straight, vertical, confronting surfaces on the movable and stationary MEM elements. Alternatively, other conventional removal or etching techniques, such as RIE, may be used to remove the selected portions of device layer 26. In any event, a very high aspect ratio may be provided for the MEM elements, for example of the order of 20:1 to 100:1. Such very narrow, deep elements provide high capacitance values that are easy to detect. Elements 40 will be mechanically coupled to each other by insulating bridge 30, with the distance between the elements dependent on the particular application for which the MEM device is used.

Figure 1K:
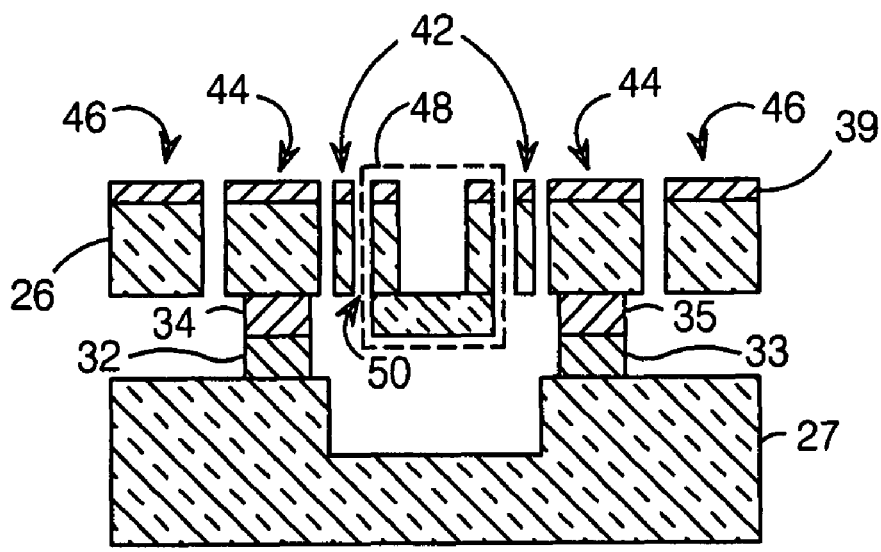

FIG. 1k shows the final stage of fabrication, after adhesive underfill 38 has been selectively etched away to mechanically uncouple or release movable MEM elements 48, 42, and 46 from substrate 27. Movable MEM element 48 comprises a unitary structure including the members 40 and the insulating bridge 30 supporting and coupling the electrically isolated members 40. Etching of the adhesive underfill 38 is preferably accomplished utilizing an oxygen plasma etch, but could be accomplished in other ways including a variety of wet or dry processes commonly used in conventional semiconductor etching techniques.

Apertures (not shown) may be formed in the bridge 30, preferably when the bridge is patterned on the wafer 20, to facilitate passage of the etchant to the adhesive underfill to accelerate the process of removing the adhesive.

In accordance with the present invention, the adhesive is completely removed from the device. This eliminates the adhesive-related upper limit on temperature associated with prior art devices which use an organic adhesive to bond the wafer to the substrate.

Another advantage is that, since all adhesive is removed from the device, there is no possibility of mismatch between the adhesive's coefficient of thermal expansion (CTE) and that of the substrate, as can occur with prior art designs. This enables any calibration of the device to be stable to a high temperature.

As explained, the etching away of adhesive 38 releases the MEM elements that are movable with respect to the stationary MEM elements. A released element may comprise, for example, a cantilever beam fixed at one end to the substrate 27. Alternatively, a released element may comprise a simple beam fixed to the substrate 27 at the opposed, distal ends of the beam. The MEM device of FIG. 1k that is ultimately fabricated may function as any of a number of different device types, such as an accelerometer, current sensor, electrical switch, tunable capacitor, or viscosity sensor. For example, if the device is a tunable capacitor, movable element 48, in response to an external stimulus, moves laterally in relation to elements 42, thereby varying the size of a capacitive gap 50 adjacent each side of element 48. Accordingly, the change in the output capacitance of the MEM device provides an indication of the magnitude of an applied signal or a physical variable such as acceleration.

It may be desirable to provide electronic circuits adjacent to the MEM device. This may be accomplished by fabricating the circuits directly on wafer 20 or on substrate 27 before, during, or after the MEM fabrication process.

Note that, since the preferred thermocompression bonds joining substrate 27 to wafer 20 are metal, preferably Au, they could be used to conduct a power form or signal between substrate 27 and wafer 20.

As noted above, the described fabrication method could be used for many different device types. By way of example, the method is suitably employed to form a MEM viscosity sensor, similar to that described in co-pending patent application Ser. No. 10/956,229 filed on Sep. 30, 2004, which is assigned to the same assignee as the present application and is fully incorporated herein by reference. As shown in the plan view of FIG. 2, an exemplary MEM viscosity sensor 100 is disposed on a supporting substrate 102. In the embodiment shown, viscosity sensor 100 comprises a transverse, centrally located, compliant suspension 104 carrying a longitudinally-extending arm 106. The arm 106 includes transverse ends 108 and 110 coupled to compliant, electrically conductive suspension beams 112 and 114, via electrically insulating bridges 116 and 118, respectively, fabricated of, for example, silicon dioxide. Arm 106 and suspensions 104, 112 and 114 are mechanically coupled together to move longitudinally as a single unit with respect to the substrate 102, to form a motion actuator. Bridges 116 and 118, however, electrically isolate arm 106 from the electrically conductive suspensions 112 and 114. Suspension 104 is coupled at its opposed outer ends to anchors 120 and 122 affixed to substrate 102. Similarly, the outer ends of suspensions 112 and 114 are coupled to anchor pairs 124, 126 and 128, 130 respectively, affixed to substrate 102.

Sensor 100 further comprises comb sense capacitors 132, 134, 136 and 138 (also known as interdigitated capacitors) for providing signals to an external output circuit representing the displacement of the arm 106 from its rest position. The comb capacitors are identical; thus, only capacitors 132 and 134 will be described.

Comb capacitor 132 comprises a fixed member 140 having a plurality of cantilevered support members 142. Comb fingers 144, also referred to as comb plates, extend longitudinally from support members 142 to provide a large surface area for interacting with liquids. Capacitor 132 further comprises a plurality of members 146 cantilevered from the moveable arm 106. Comb fingers 148 extend longitudinally from members 146, and are configured to interleave with the comb fingers 144. As with comb fingers 144, moveable comb fingers 148 also provide a large surface area for interacting with liquids. Comb fingers 144 and 148 are made from electrically conductive materials. As such, comb fingers 144 and 148 form a capacitor whose capacitance varies with the amount of overlap between fingers 144 and 148.

Figure 2:
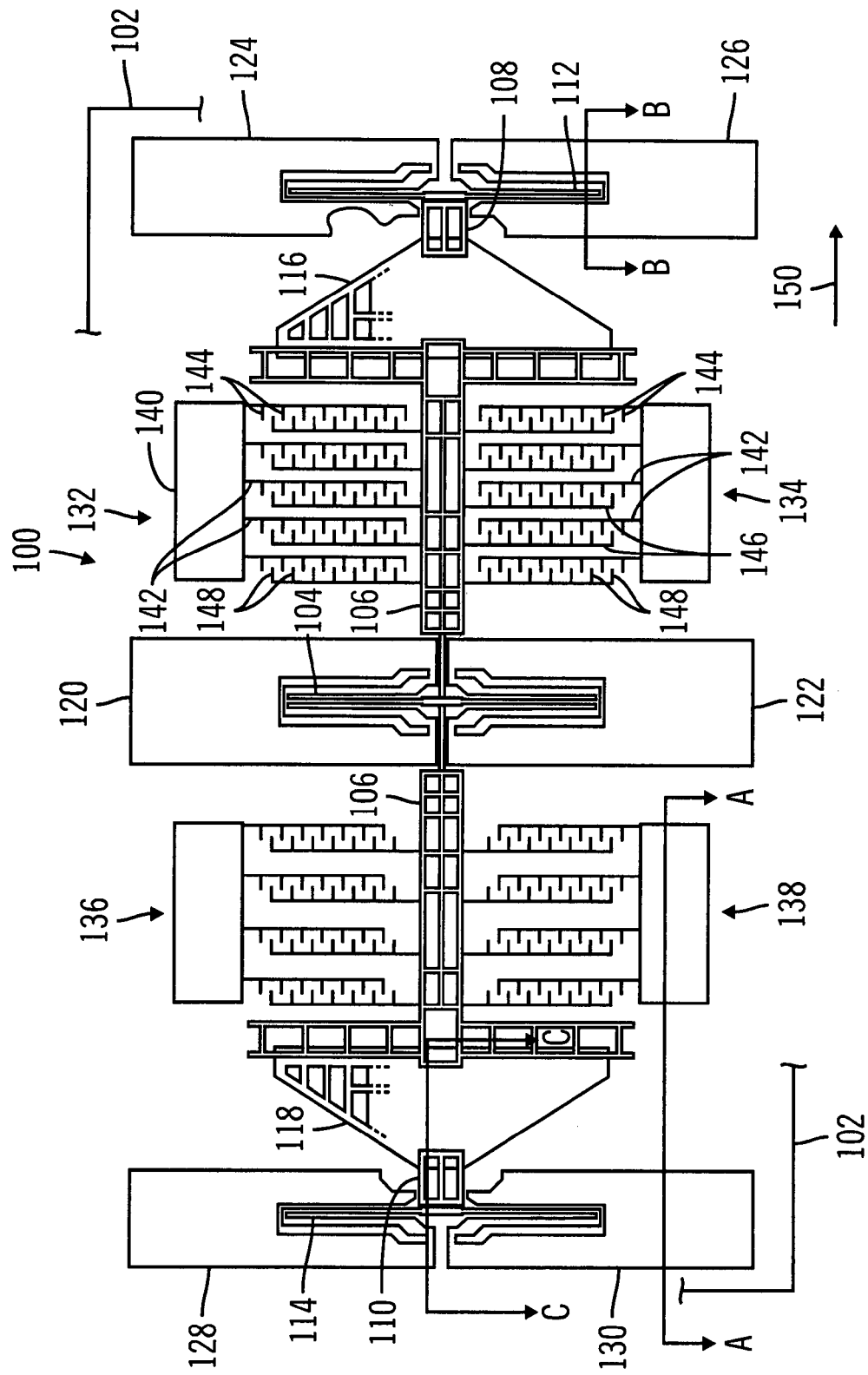
FIG. 2 is a plan view of a MEM viscosity sensor in accordance with the present invention.

Sensor 100 is coupled to a drive actuator, which causes transverse suspensions 112, 114 to move bridges 116, 118 longitudinally in the plane of FIG. 2 such that fingers 144 move parallel to fingers 148. The drive actuator can be, for example, an electrostatic, thermal, piezoelectric or Lorentz force actuator. Descriptions of actuators suitable for use in embodiments of the illustrated viscosity sensor can be found, for example, in U.S. Pat. No. 5,025,346 (electrostatic), and U.S. Patent Application Publication US 2004/0027029 (Lorentz).

Connections to one or more external circuits are made via anchors 124, 126, 128 and 130 carrying suspensions 112 and 114, to which the anchors are electrically connected. When actuated, arm 106 and the moveable portions of interconnected compliant suspensions 104, 112 and 114 move laterally as indicated by the arrow 150. For the specific embodiment of a device operating through Lorentz force actuation (and shown in FIG. 2), as the current flowing through one of the suspensions varies, the distance that arm 106 moves varies, thereby varying the overlap between comb fingers 144 and 148 and thus the capacitance between them.

If the capacitors are immersed in a liquid, the movement of comb fingers 144, 148 is dampened upon the application of a driving force from the drive actuator. The response time of the device, as determined through capacitive sensing, provides a measure of the fluid viscosity.

Illustrations of the use of the described fabrication method as it might be used with the sensor of FIG. 2 are shown in FIGS. 3*a*-3*c*. FIG. 3*a* is a cross-sectional view cut along section line A-A in FIG. 2, and shows mechanical bonds 200, 202 per the present invention forming portions of anchor structures 130 and 138, respectively. Also shown are a conductive layer (layer 39 from FIGS. 1*a*-1*k*), a device layer (26), a recess (36) and an insulating layer 204 which is preferably present between substrate 102 and anchors 130 and 138.

FIG. 3*b* is a cross-sectional view cut along section line B-B in FIG. 2, and shows the use of mechanical bonds 206, 208 forming portions of anchor structure 126 on either side of conductive suspension beams 112. Conductive layer 39, device layer 26, recess 36 and insulating layer 204 are also shown.

Similarly, FIG. 3*c* is a cross-sectional view cut along section line C-C in FIG. 2, and shows the use of mechanical bonds 210 forming a portion of anchor structure 128. Conductive suspension beams 114, conductive layer 39, device layer 26, recess 36, insulating layer 204, and a portion of longitudinally-extending arm 106 and insulating bridge 118 can also be seen.

Embodiments of a viscosity sensor as described herein can be utilized in a variety of situations in which measurements determining the health of a liquid are desired. For example, a sensor can be installed in the oil tank of a vehicle or machine, or in a separate testing apparatus to which liquid samples are brought. As a consequence of being formed in accordance with the fabrication method described herein, the sensor can be immersed in a fluid having a higher temperature than was possible using prior art methods.

Note that the viscosity sensor shown in FIGS. 2 and 3 is merely one possible example of a MEM device per the present invention. It is only required that such a device include a separate wafer and substrate, which are bonded together to form a composite structure using a high temperature bond as described herein, preferably an Au—Au thermocompression bond, with the composite structure patterned to form a desired MEM device.

MEM devices in accordance with the present invention could find application in many environments which might otherwise be unduly hostile. For example, the present high temperature devices could be used for in-situ fluid health monitoring, immersed, for example, in the working fluids of pumps, turbines, engines, etc. They might also be advantageously employed in fluid processing applications, such as in the chemical or food processing industries, where chemical inertness is critical.

While particular embodiments of the invention have been shown and described, numerous variations and alternate embodiments will occur to those skilled in the art. Accordingly, it is intended that the invention be limited only in terms of the appended claims.

We claim:

1. A microelectromechanical (MEM) device having a stationary element and a movable element displaceable relative to the stationary element, comprising:
    a semiconductor wafer;
    a substrate;
    said wafer and substrate having respective bonding pads which are aligned and mechanically connected such that a high temperature thermocompression bond is formed to effect the bonding of said wafer to said substrate and thereby form a composite structure;
    portions of said composite structure patterned and etched to define the stationary and movable MEM elements such that said movable element is mechanically coupled to said stationary element;
    a drive means for displacing said movable element laterally relative to said stationary element;
    a sensing means arranged to sense the capacitance between said movable and stationary elements; and
    at least one insulating bridge which mechanically couples but electrically isolates at least one portion of said movable element from at least one other portion of said movable element, such that said sensing means is electrically isolated from said drive means;
    wherein said wafer and substrate bonding pads are metal and said thermocompression bond is used to conduct electrical signals between said semiconductor wafer and said substrate.

2. The device of claim 1, wherein said bonding pads are gold (Au) such that said bond is an Au—Au thermocompression bond.

3. The device of claim 1, further comprising one or more metallization layers deposited on said composite structure and patterned and etched to provide electrical interconnections for said MEM device, said metallization layers comprising a conductive refractory material.

4. The device of claim 3, wherein said conductive refractory material is selected from a group consisting of platinum, iridium, gold or titanium nitride.

5. The device of claim 1, wherein said MEM device is arranged to sense the viscosity of a fluid in which the device is immersed.

6. The device of claim 5, wherein said movable element and said stationary element are conductive and at least partially overlap so as to produce a capacitance which varies with the amount of overlap, said device further comprising a drive means for displacing said movable element relative to said stationary element.

7. The device of claim 6, further comprising a sensing means for sensing said amount of overlap.

8. The device of claim 7, wherein said sensing means is arranged to sense the capacitance between said movable and stationary elements.

9. The device of claim 6, wherein said drive means is selected from a group consisting of a thermal actuator or piezoelectric actuator, said actuator coupled to said movable element.

10. The device of claim 1, wherein said wafer is a silicon-on-insulator (SOI) wafer.

11. The device of claim 1, wherein said substrate is an insulating substrate.

12. The device of claim 1, wherein said substrate is a conducting substrate.

13. The device of claim 1, wherein said substrate is a semiconductor wafer containing pre-processed circuitry.

14. The device of claim 1, further comprising a recess etched into said substrate which allows fluid to flow through said device when immersed in fluid.

15. A microelectromechanical (MEM) viscosity sensor arranged to sense the viscosity of a fluid in which the device is immersed, comprising:
a semiconductor wafer having at least one bonding pad;
a substrate having at least one bonding pad, the bonding pads of said wafer and substrate aligned and mechanically connected to form a high temperature thermocompression bond between said wafers and thereby form a composite structure, portions of said composite structure patterned and etched to define a stationary element and a movable element such that said movable element is mechanically coupled to said stationary element, said movable element and said stationary element conductive and at least partially overlapping so as to produce a capacitance which varies with the amount of overlap;
a drive means for displacing said movable element laterally relative to said stationary element;
a sensing means arranged to sense the capacitance between said movable and stationary elements;
a means of determining the response time of the device based on said capacitive sensing, the viscosity of said fluid varying with said response time; and
at least one insulating bridge which mechanically couples but electrically isolates at least one portion of said movable element from at least one other portion of said movable element, such that said sensing means is electrically isolated from said drive means;
wherein said wafer and substrate bonding pads are metal and said thermocompression bond is used to conduct electrical signals between said semiconductor wafer and said substrate.

16. The viscosity sensor of claim 15, further comprising one or more metallization layers deposited on said composite structure and patterned and etched to provide electrical interconnections for said MEM device, said metallization layers comprising a conductive refractory material.

17. The viscosity sensor of claim 15, wherein said composite structure is patterned and etched to form first and second set of conductive plates spaced apart from each other and having respective parallel surface areas, said first set of plates arranged to interleave with said second set of plates such that their surface areas at least partially overlap to produce said capacitance, one of said sets of plates being said movable element.

18. The device of claim 15, further comprising a recess etched into said substrate which allows fluid to flow through said device when immersed in fluid.

19. A microelectromechanical (MEM) device having a stationary element and a movable element displaceable relative to the stationary element, comprising:

a semiconductor wafer;
a substrate;
a high temperature bond which bonds said wafer to said substrate to form a composite structure;
portions of said composite structure patterned and etched to define the stationary and movable MEM elements such that said movable element is mechanically coupled to said stationary element;
a drive means for displacing said movable element laterally relative to said stationary element;
a sensing means arranged to sense the capacitance between said movable and stationary elements;
at least one insulating bridge which mechanically couples but electrically isolates at least one portion of said movable element from at least one other portion of said movable element, such that said sensing means is electrically isolated from said drive means; and
one or more metallization layers deposited on said composite structure and patterned and etched to provide electrical interconnections for said MEM device, said metallization layers comprising a conductive refractory material.

20. A microelectromechanical (MEM) viscosity sensor arranged to sense the viscosity of a fluid in which the device is immersed, comprising:
a semiconductor wafer having at least one bonding pad;
a substrate having at least one bonding pad, the bonding pads of said wafer and substrate aligned and mechanically connected to form a high temperature thermocompression bond between said wafers and thereby form a composite structure, portions of said composite structure patterned and etched to define a stationary element and a movable element such that said movable element is mechanically coupled to said stationary element, said movable element and said stationary element conductive and at least partially overlapping so as to produce a capacitance which varies with the amount of overlap;
a drive means for displacing said movable element laterally relative to said stationary element;
a sensing means arranged to sense the capacitance between said movable and stationary elements;
a means of determining the response time of the device based on said capacitive sensing, the viscosity of said fluid varying with said response time;
at least one insulating bridge which mechanically couples but electrically isolates at least one portion of said movable element from at least one other portion of said movable element, such that said sensing means is electrically isolated from said drive means; and
one or more metallization layers deposited on said composite structure and patterned and etched to provide electrical interconnections for said MEM device, said metallization layers comprising a conductive refractory material.

* * * * *